United States Patent
Matsumoto et al.

(10) Patent No.: US 11,437,296 B2
(45) Date of Patent: Sep. 6, 2022

(54) SEMICONDUCTOR PACKAGE, SEMICONDUCTOR APPARATUS, AND METHOD FOR MANUFACTURING SEMICONDUCTOR PACKAGE

(71) Applicant: KYOCERA Corporation, Kyoto (JP)

(72) Inventors: Hiroshi Matsumoto, Kirishima (JP); Hiroki Ito, Kirishima (JP); Takashi Kimura, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 70 days.

(21) Appl. No.: 16/976,241

(22) PCT Filed: Feb. 27, 2019

(86) PCT No.: PCT/JP2019/007641
§ 371 (c)(1),
(2) Date: Aug. 27, 2020

(87) PCT Pub. No.: WO2019/168056
PCT Pub. Date: Sep. 6, 2019

(65) Prior Publication Data
US 2021/0020540 A1     Jan. 21, 2021

(30) Foreign Application Priority Data
Feb. 27, 2018  (JP) .............................. JP2018-033049

(51) Int. Cl.
*H01L 23/373*     (2006.01)
*H01L 21/48*      (2006.01)
(Continued)

(52) U.S. Cl.
CPC ...... *H01L 23/3735* (2013.01); *H01L 21/4882* (2013.01); *H01L 23/047* (2013.01);
(Continued)

(58) Field of Classification Search
None
See application file for complete search history.

(56) References Cited

U.S. PATENT DOCUMENTS 5,780,927 A  *  7/1998  Nomura ................... H01L 23/13
                                                     257/706
2002/0051353 A1*  5/2002  Osakada ................. H01L 23/66
                                                     361/820
(Continued)

FOREIGN PATENT DOCUMENTS

EP           1729343 A2 *  12/2006   ............. H01L 24/80
JP       2002-093931 A      3/2002

*Primary Examiner* — Shaun M Campbell
*Assistant Examiner* — Aneta B Cieslewicz
(74) *Attorney, Agent, or Firm* — Volpe Koenig

(57) ABSTRACT

A semiconductor package in an aspect of the present invention includes a metal board, a first frame, a second frame, and a bond. The metal board has an upper surface including a mount on which a semiconductor device is mountable. The first frame has a side surface facing a side surface of the metal board and has a smaller thermal expansion coefficient than the metal board. The second frame is on upper surfaces of the metal board and the first frame and surrounds the mount, and has a smaller thermal expansion coefficient than the metal board. The bond is between the metal board and the first frame, between the metal board and the second frame, and between the first frame and the second frame. The semiconductor package includes an alloy layer between the metal board and the bond.

19 Claims, 11 Drawing Sheets

(51) Int. Cl.
*H01L 23/14* (2006.01)
*H01L 23/00* (2006.01)
*H01L 23/36* (2006.01)
*H01L 23/047* (2006.01)
*H01L 23/08* (2006.01)

(52) U.S. Cl.
CPC .............. *H01L 23/08* (2013.01); *H01L 23/14* (2013.01); *H01L 23/36* (2013.01); *H01L 23/562* (2013.01)

(56) References Cited

U.S. PATENT DOCUMENTS

2006/0249835 A1* 11/2006 Miyauchi .............. H01L 23/047
　　　　　　　　　　　　　　　　　　257/706
2015/0279754 A1* 10/2015 Saegusa .............. H01L 23/3735
　　　　　　　　　　　　　　　　　　257/690

* cited by examiner

SEMICONDUCTOR PACKAGE, SEMICONDUCTOR APPARATUS, AND METHOD FOR MANUFACTURING SEMICONDUCTOR PACKAGE

FIELD

The present invention relates to a semiconductor package in which a semiconductor device is mountable, a method for manufacturing the semiconductor package, and a semiconductor apparatus including the semiconductor package.

BACKGROUND

A known semiconductor package may incorporate a semiconductor device that operates with high-frequency signals. Such a semiconductor device generates heat during operation. To dissipate heat outside, a known semiconductor package includes a metal board on which a semiconductor device or other components are mountable to improve heat dissipation (Japanese Unexamined Patent Application Publication No. 2002-93931).

Japanese Unexamined Patent Application Publication No. 2002-93931 describes a high-frequency ceramic package including a first metal plate, a second metal plate, and a looped ceramic frame. The first metal plate has side surfaces joined to the inner walls of the second metal plate with a bond.

In the structure described in Patent Literature 1, the first metal plate expands and contracts, applying a load on the second metal plate and the looped ceramic frame and causing breaks in the second metal plate and the looped ceramic frame.

BRIEF SUMMARY

A semiconductor package according to one aspect of the present invention includes a metal board, a first frame, a second frame, and a bond. The metal board has an upper surface including a mount on which a semiconductor device is mountable. The first frame has a side surface facing a side surface of the metal board and has a smaller thermal expansion coefficient than the metal board. The second frame is on upper surfaces of the metal board and the first frame and surrounds the mount, and has a smaller thermal expansion coefficient than the metal board. The bond is between the metal board and the first frame, between the metal board and the second frame, and between the first frame and the second frame. The semiconductor package includes an alloy layer between the metal board and the bond.

A semiconductor apparatus according to another aspect of the present invention includes the semiconductor package according to the above aspect, and a semiconductor device. The semiconductor device is mounted on the mount.

DETAILED DESCRIPTION

A semiconductor package according to one or more embodiments and a semiconductor apparatus including the semiconductor package will now be described in detail with reference to the drawings.

Structure of Semiconductor Package

Figure 1:
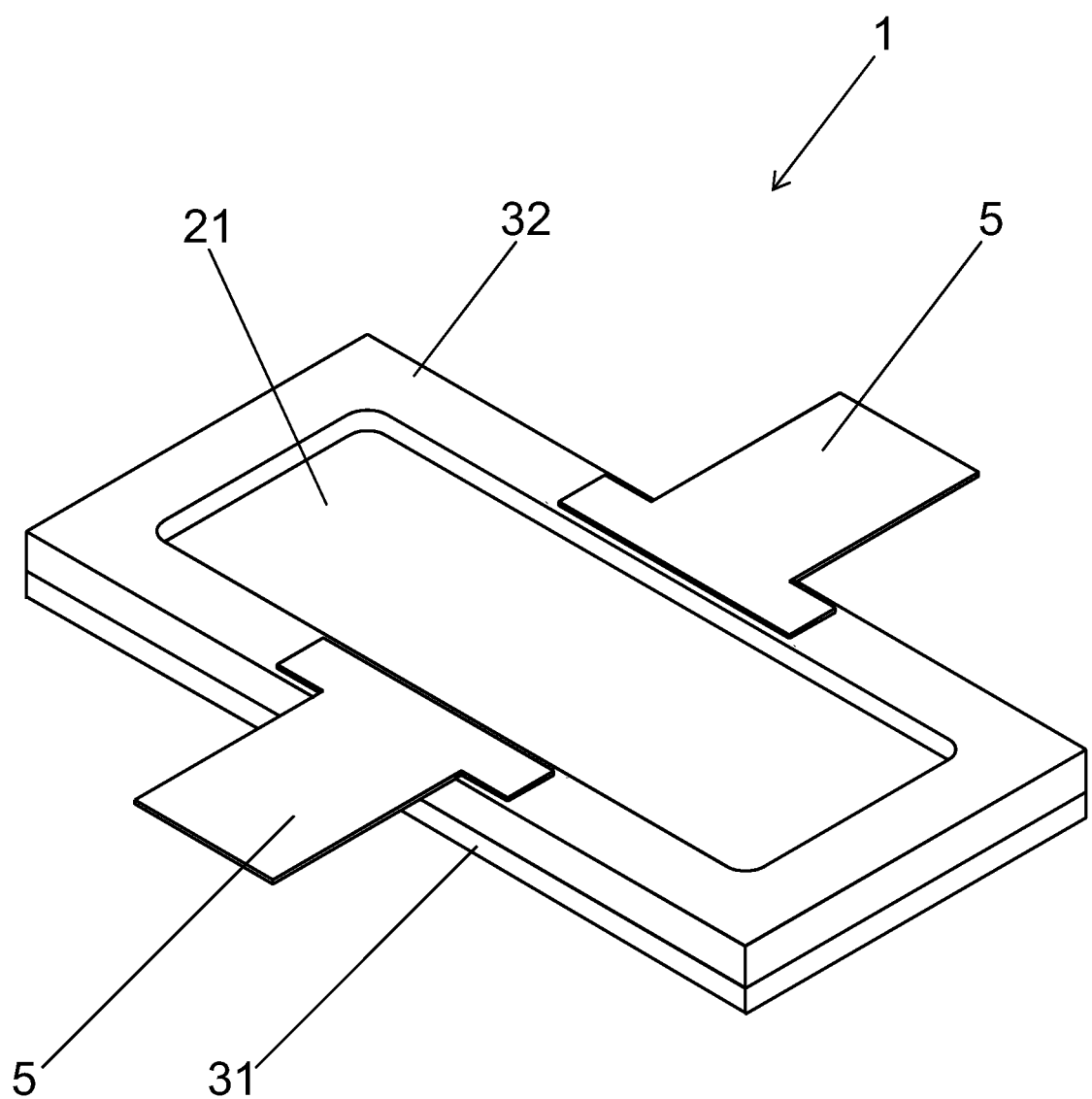
FIG. 1 is a top perspective view of a semiconductor package according to an embodiment of the present invention.
Figure 2:
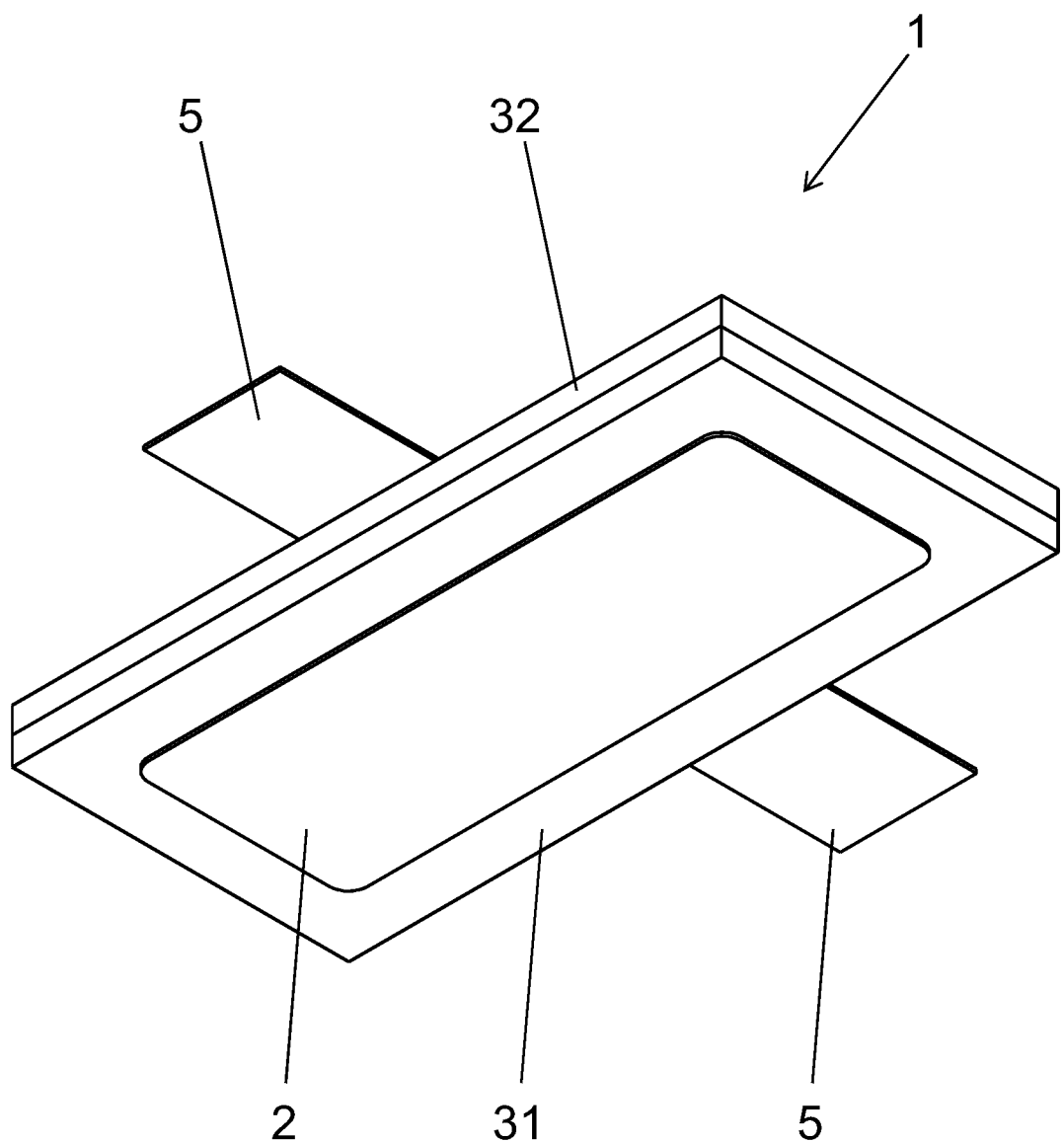
FIG. 2 is a bottom perspective view of the semiconductor package according to the embodiment of the present invention.
Figure 3:
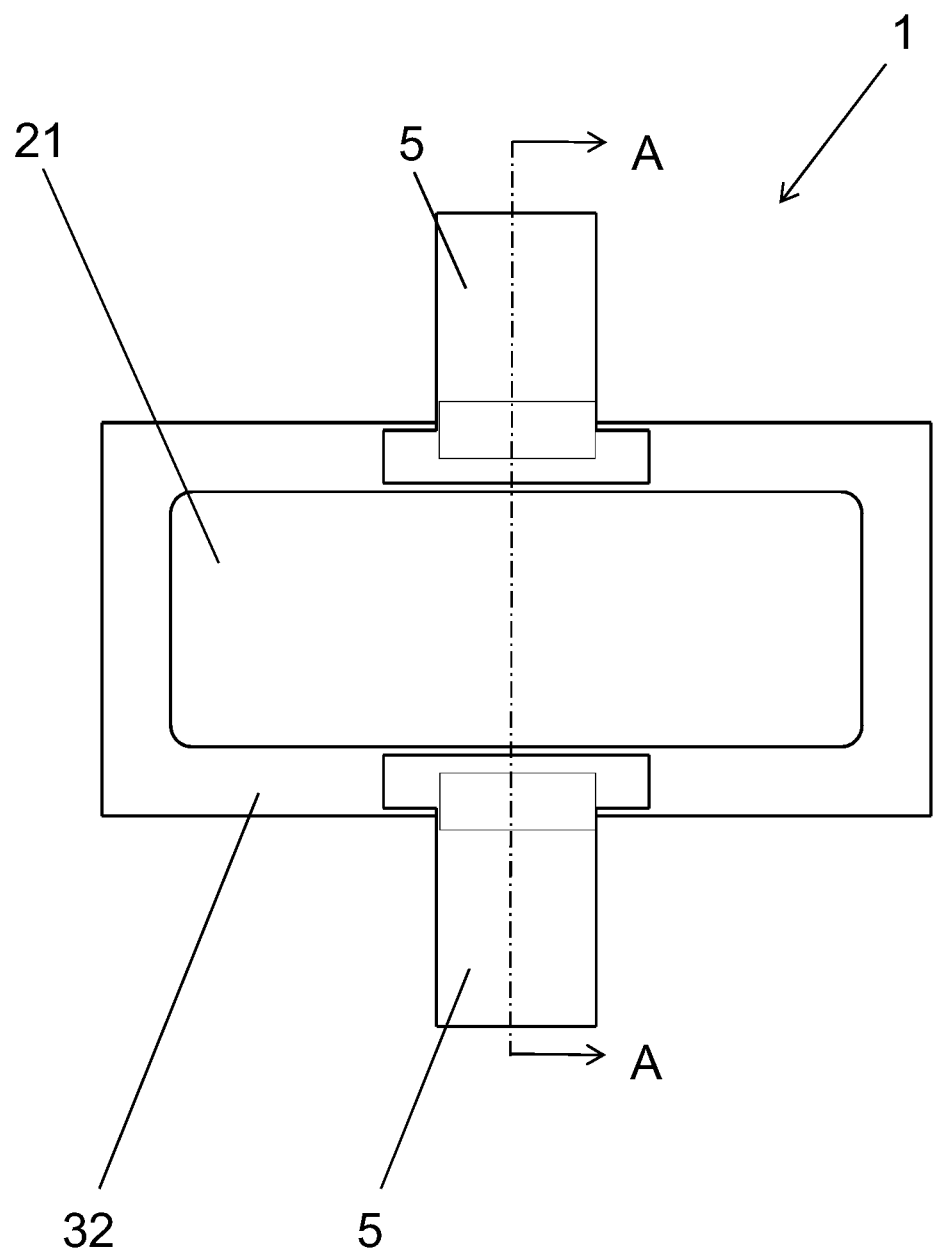
FIG. 3 is a top plan view of the semiconductor package according to the embodiment of the present invention.
Figure 4:
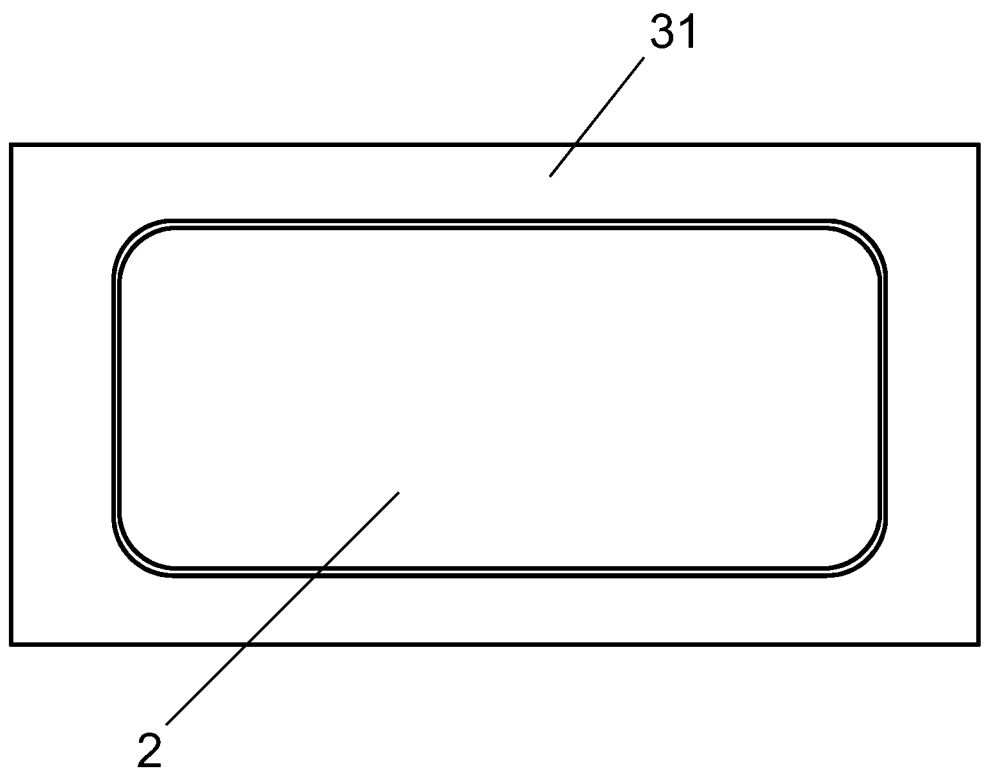
FIG. 4 is a bottom plan view of the semiconductor package according to the embodiment of the present invention.
Figure 5:
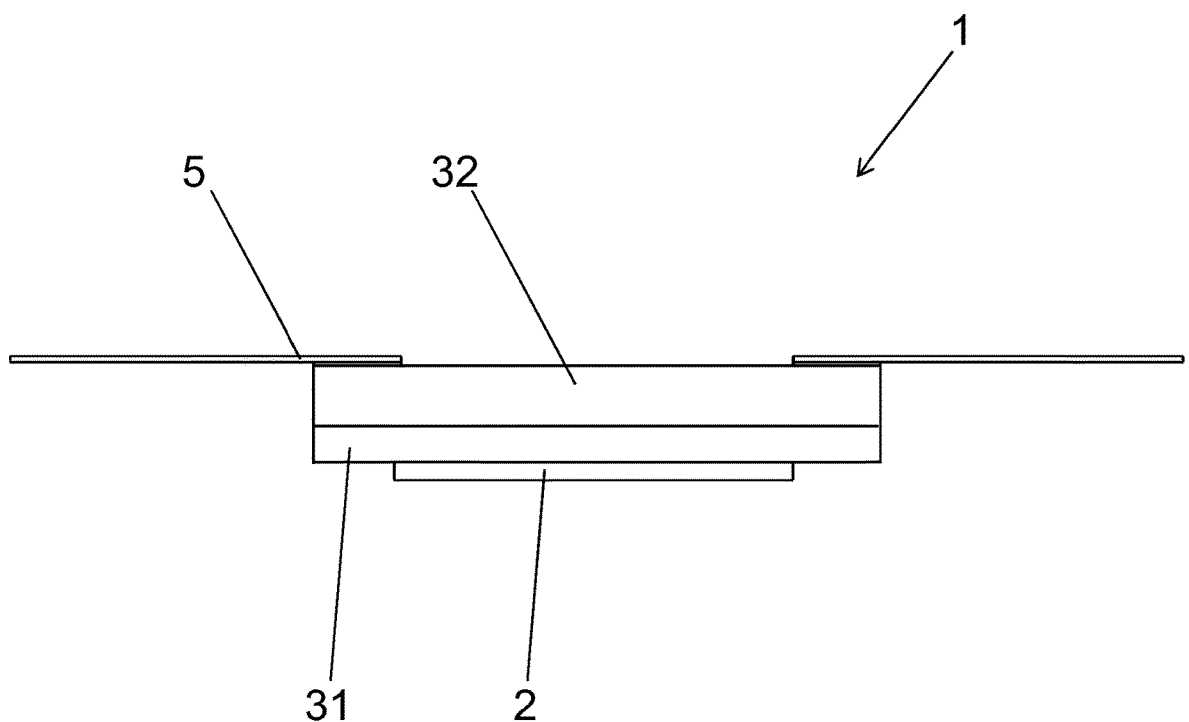
FIG. 5 is a side view of the semiconductor package according to the embodiment of the present invention.
Figure 6:
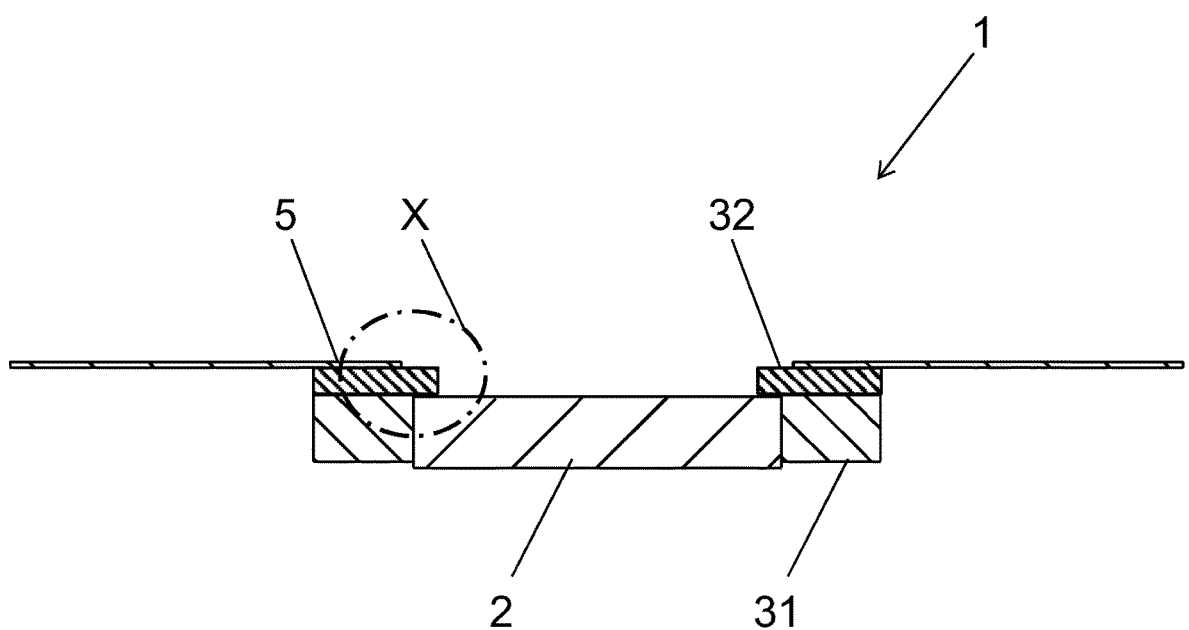
FIG. 6 is a cross-sectional view of the semiconductor package according to the embodiment of the present invention taken along line A-A in FIG. 3.
Figure 7:
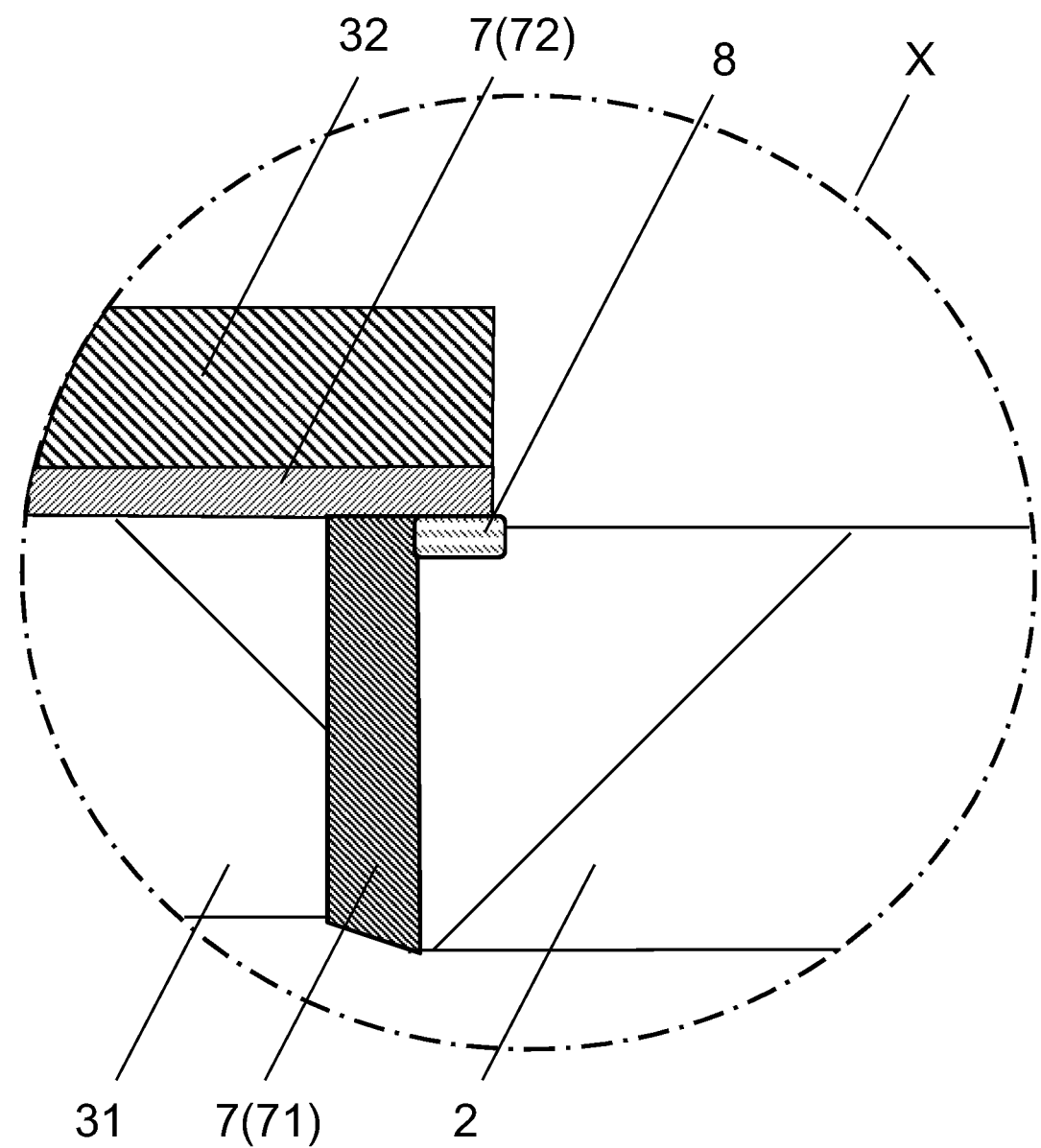
FIG. 7 is an enlarged view of portion X in the semiconductor package according to the embodiment of the present invention shown in FIG. 6.
Figure 8:
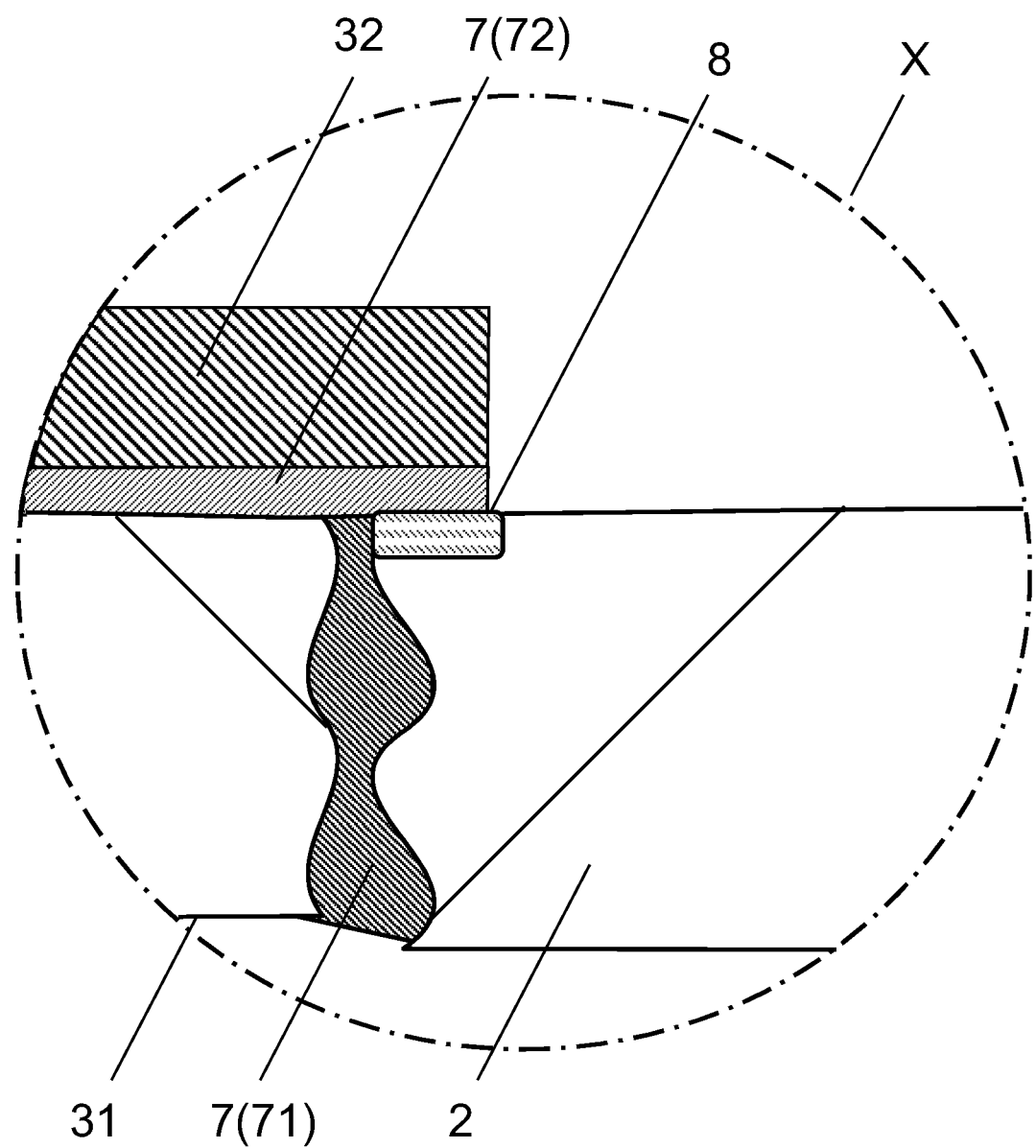
FIG. 8 is an enlarged view of another example of portion X in the semiconductor package according to the embodiment of the present invention shown in FIG. 6.
Figure 9:
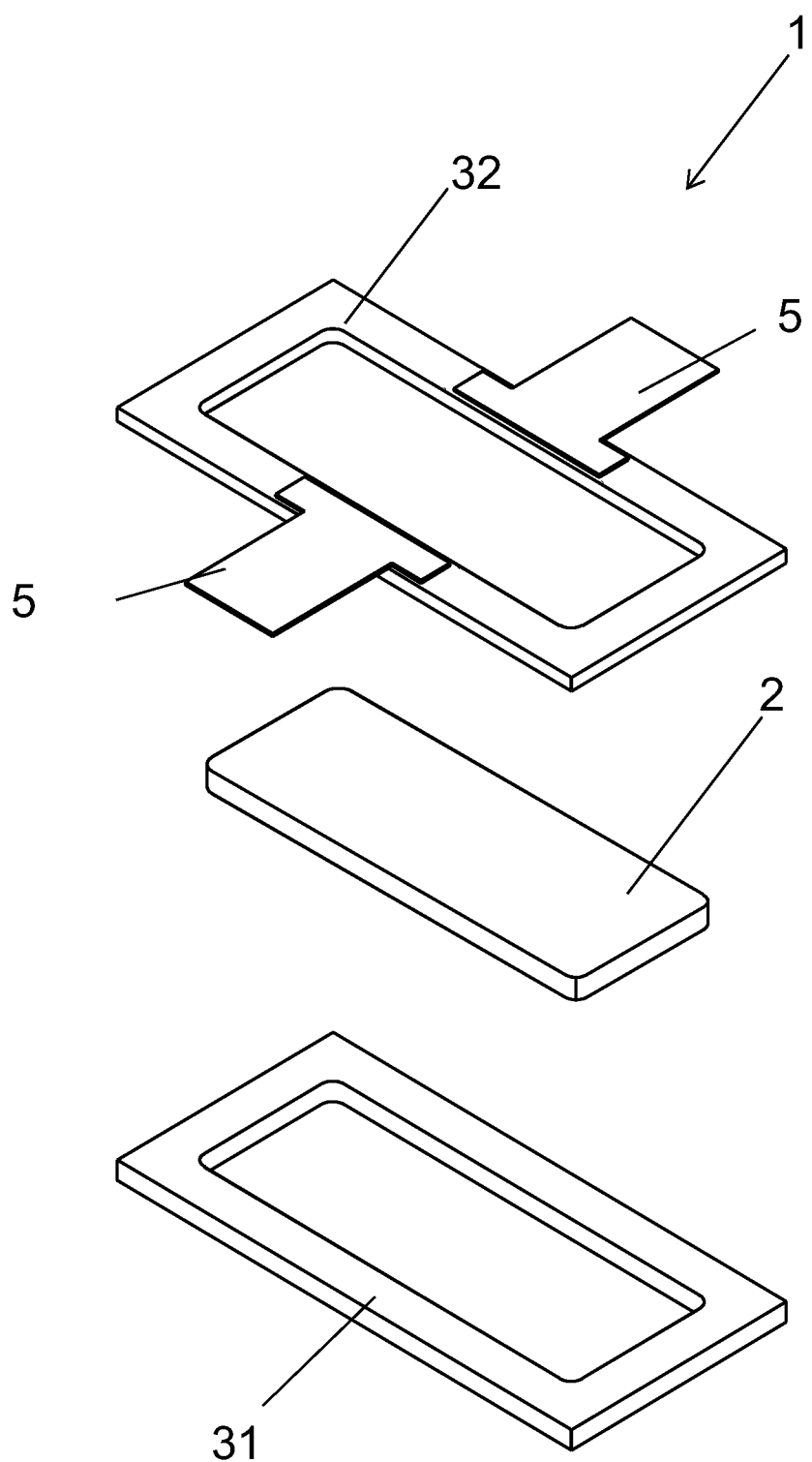
FIG. 9 is an exploded top perspective view of the semiconductor package according to the embodiment of the present invention.
Figure 10:
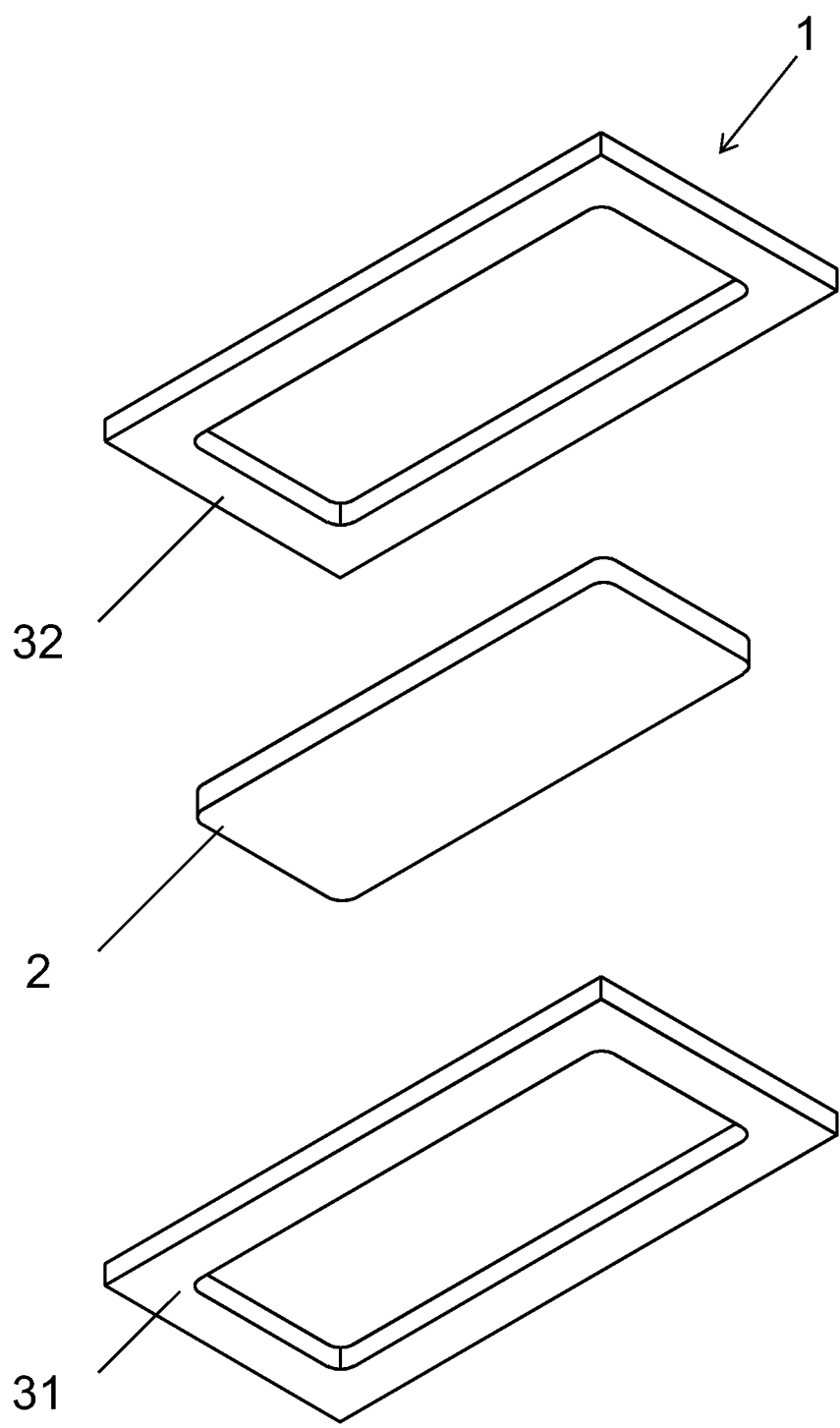
FIG. 10 is an exploded bottom perspective view of the semiconductor package according to the embodiment of the present invention.

FIG. 1 is a top perspective view of a semiconductor package according to an embodiment of the present invention. FIG. 2 is a bottom perspective view of the semiconductor package according to the embodiment of the present invention. FIG. 3 is a top plan view of the semiconductor package according to the embodiment of the present invention. FIG. 4 is a bottom plan view of the semiconductor package according to the embodiment of the present invention. FIG. 5 is a side view of the semiconductor package according to the embodiment of the present invention. FIG. 6 is a cross-sectional view of the semiconductor package according to the embodiment of the present invention taken along line A-A in FIG. 3. FIG. 7 is an enlarged view of portion X in the semiconductor package according to the embodiment of the present invention shown in FIG. 6. FIG. 8 is an enlarged view of another example of portion X in the semiconductor package according to the embodiment of the present invention shown in FIG. 6. FIG. 9 is an exploded top perspective view of the semiconductor package according to the embodiment of the present invention. FIG. 10 is an exploded bottom perspective view of the semiconductor package according to the embodiment of the present invention. In these figures, a semiconductor package 1 according to the embodiment of the present invention includes a metal board 2, a first frame 31, a second frame 32, a bond 7, and an alloy layer 8 between the metal board 2 and the bond 7.

As shown in FIG. 1, the metal board 2 in one embodiment of the present invention has a mount 21 on an upper surface on which a semiconductor device 4 is mountable. The metal board 2 is, for example, rectangular.

In the embodiment of the present invention, the mount 21 refers to an area that can overlap the semiconductor device 4 in a plan view of the metal board 2. The metal board 2 has dimensions of, for example, 10×10 mm to 50×50 mm. The metal board 2 has a thickness of, for example, 0.5 to 5 mm.

The metal board 2 includes, for example, a metal material having high thermal conductivity to dissipate heat outside during mounting or use of a semiconductor device. The metal material is, for example, copper. The metal board 2 including copper or formed from copper has a thermal expansion coefficient of $16\times10^{-6}$/K. The metal board 2 may also include aluminum, silver, iron, nickel, chromium, cobalt, molybdenum, tungsten, an alloy of any of these metals, or such a metal material in which diamond or carbon is dispersed. An ingot formed from such a metal material may undergo metal working, such as rolling, punching, pressing, or cutting, to prepare a metal member that serves as the metal board 2.

The first frame 31 is spaced from the side surfaces of the metal board 2. The first frame 31 has side surfaces facing the side surfaces of the metal board 2. The first frame 31 overlaps the second frame 32 in a plan view. The first frame 31 is spaced from the metal board 2 across the bond 7. The first frame 31 overlaps the second frame 32 and may be rectangular at the outer and inner peripheries. The first frame 31 is joined to the side surfaces of the metal board 2 with the bond 7, such as a silver-copper brazing material, solder, or a resin bond.

The first frame 31 may be rigid and have a thermal expansion coefficient similar to the thermal expansion coefficient of the second frame 32 described later. The first frame 31 is formed from, for example, a ceramic material. Examples of the ceramic material include sintered aluminum oxide and sintered aluminum nitride. Similarly to the metal board 2, the first frame 31 may also be formed from a metal material. Examples of the metal material include metals such as molybdenum, and alloys of metals such as iron, copper, nickel, chromium, cobalt, molybdenum, and tungsten, or for example, an Fe—Ni—Co alloy. The first frame 31 may be formed from a metal material having a smaller thermal expansion coefficient than the material for the metal board 2. This reduces thermal expansion of the metal board 2 near the lower surface of the metal board 2. A material having a thermal expansion similar to that of the second frame 32 is selected for the first frame 31 to reduce warpage resulting from a difference in thermal expansion coefficient between upper and lower holding members. Also, the first frame 31 formed from a rigid material causes less deformation.

The first frame 31 may have inner walls (inner side surfaces) in contact with, rather than being joined to, the side surfaces of the metal board 2. In this case, the inner walls of the first frame 31 are partly in contact with the side surfaces of the metal board 2 and partly slightly spaced apart from the side surfaces of the metal board 2. With the inner walls of the first frame 31 in contact with the side surfaces of the metal board 2 instead of being fixed to the side surfaces of the metal board 2 with a bond, the bond 7 and the first frame 31 can have less cracks resulting from the difference in thermal expansion coefficient when the metal board 2 thermally expands and presses the first frame 31 than when the inner walls of the first frame 31 and the side surfaces of the metal board 2 are joined together. The semiconductor package 1 with this structure can have less stress around the inner walls of the first frame 31 resulting from the difference in thermal expansion coefficient between the metal board 2 and the first frame 31. The semiconductor package 1 according to the embodiment of the present invention can reduce cracks or breaks in the first frame 31 and thus has less damage.

The first frame 31 is a frame with dimensions of, for example, 10×10 mm to 50×50 mm at the outer periphery and 5×5 mm to 49×49 mm at the inner periphery in a plan view. The first frame 31 has a width, or a dimension between the outer and inner peripheries, of 1 to 5 mm, for example. The first frame 31 has a height of 0.05 to 3.9 mm.

With the inner walls in contact with the side surfaces of the metal board 2, the first frame 31 can reduce horizontal thermal expansion of the metal board 2 at the side surfaces. Thus, the semiconductor package 1 according to the embodiment of the present invention can reduce deformation or warpage of the metal board 2 and maintain the flatness of the mount 21. With the inner walls of the first frame 31 in contact with the side surfaces of the metal board 2, heat generated in the semiconductor device 4 or other components can be released through the metal board 2 directly to the first frame 31. The metal board 2 can have higher heat dissipation. This also reduces thermal expansion of the metal board 2, thus maintaining the flatness of the mount.

The first frame 31 may have the inner walls joined to the side surfaces of the metal board 2 with a bond, such as a silver-copper brazing material, gold-tin solder, or a resin bond. This structure enables the first frame 31 to reduce horizontal thermal expansion of the metal board 2 at the side surfaces of the metal board 2 and releases heat in the metal board 2 through the bond to the first frame 31. Thus, the semiconductor package 1 can have higher heat dissipation through the metal board 2 and the first frame 31.

The metal board 2 may have a lower surface below the first frame 31. Thus, the semiconductor package 1 can have the metal board 2 that is likely to be exposed outside. The metal board 2 is thus easily joined to an external mounting board when a semiconductor apparatus 10 is mounted on the mounting board. Thus, the semiconductor package 1 can have higher heat dissipation through the metal board 2. In other words, heat generated in the semiconductor device 4 mounted on the mount 21 is easily released through the metal board 2 to the external mounting board.

The second frame 32 surrounds the mount 21 on the metal board 2. The second frame 32 is rectangular at the outer and inner peripheries, and has four side walls in a plan view. The second frame 32 is joined to the upper surface of the metal board 2 with the bond 7, such as a silver-copper brazing material or solder described later. The second frame 32 may include or be formed from the same material as the metal board 2. The second frame 32 may be integral with the metal board 2.

The second frame 32 has dimensions of, for example, 10×10 mm to 50×50 mm at the outer periphery and 5×5 mm to 49×49 mm at the inner periphery in a plan view. The second frame 32 has a width, or a dimension between the outer and inner peripheries, of 1 to 5 mm, for example. The second frame 32 has a height of 1 to 10 mm.

The second frame 32 may have a thermal expansion coefficient similar to the thermal expansion coefficient of the first frame 31. The second frame 32, which receives lead terminals 5 (described later) mounted on its upper surface, is formed from an insulating material for wiring. The second frame 32 may be formed from, for example, a ceramic material or a resin material. Examples of the ceramic material include sintered aluminum oxide and sintered aluminum nitride. The second frame 32 may be formed from a material having a smaller thermal expansion coefficient than the material for the metal board 2. The second frame 32 having a smaller thermal expansion coefficient than the metal board 2 can reduce thermal expansion of the metal board 2 at the upper surface.

The bond 7 is between the metal board 2 and the first frame 31, between the metal board 2 and the second frame 32, and between the first frame 31 and the second frame 32. Examples of the bond 7 include a tin-containing silver-copper brazing material, lead-free solder, gold-tin solder, a bond including, for example, indium or bismuth, silver (sintered silver), and adhesives.

With the bond 7 including at least one of the above materials, the alloy layer 8 forms between the metal board 2 and the bond 7 when the bond 7 is heated to join the metal board 2 to the first frame 31 and to the second frame 32. The alloy layer 8 is between the metal board 2 and the second frame 32 and between the metal board 2 and the bond 7. The alloy layer 8 has a thickness of 1 to 50 μm. In a plan view, the alloy layer 8 has the same size as the overlap between the second frame 32 and the metal board 2. For example, the alloy layer 8 has a width of 0.1 to 2.0 mm in a plan view. The alloy layer 8 includes a copper-tin alloy when the metal board 2 includes copper and the bond 7 includes tin.

The alloy layer 8 may include crystals elongated in the thickness direction of the metal board 2, and may have more crystals growing in a portion adjacent to the metal board 2. The metal board 2 may be misaligned under thermal expansion in the direction crossing the direction of crystal growth. The metal board 2 is thus less likely to be misaligned. The bond 7 may be slightly inward from the outer peripheries of the first frame 31 and the second frame 32. The bond 7 may extend below the lower surface of the first frame 31.

The metal board 2 has the lower surface below the lower surface of the first frame 31. The metal board 2 has an upper surface on which the semiconductor device 4 is mountable. This structure generates heat during use or mounting of the semiconductor device 4. The heat is released outside through the metal board 2. The metal board 2 has the lower surface that is likely to be exposed outside. This improves heat dissipation.

The metal board 2 and the first frame 31 may have curved side surfaces joined with the bond 7. The curves increase the bonding area and improve the strength of bonding.

The semiconductor package 1 according to the embodiment of the present invention has the above structure to improve heat dissipation and reduce breaks. The metal board 2 is held by the first frame 31 and the second frame 32 having a smaller thermal expansion coefficient than the metal board 2, and thus has less deformation in the mount 21 on which the semiconductor device 4 is mountable. The alloy layer 8 further increases the bonding strength.

The semiconductor package 1 according to one embodiment of the present invention may satisfy $\alpha \geq \beta$ and $H1 \leq H2$, where $\alpha$ is the thermal expansion coefficient of the second frame 32, $\beta$ is the thermal expansion coefficient of the first frame 31, H1 is the thickness of the second frame 32 orthogonal to the mount 21, and H2 is the thickness of the first frame 31 orthogonal to the mount 21. The semiconductor package 1 according to the embodiment of the present invention thus has less warpage of the metal board 2 resulting from the difference in thermal expansion coefficient between the metal board 2 and the first frame 31 and between the first frame 31 and the second frame 32.

When the first frame 31 has the inner walls in contact with the side surfaces of the metal board 2, the first frame 31 flattens the metal board 2 that may warp or deform due to the difference in thermal expansion coefficient between the metal board 2 and the first and second frames 31 and 32, thus reducing the warpage or deformation of the metal board 2.

The semiconductor package 1 according to one embodiment of the present invention may have the first frame 31 and the second frame 32 including or formed from the same material. For example, the first frame 31 and the second frame 32 are both formed from sintered aluminum oxide and have a thermal expansion coefficient of $7 \times 10^{-6}$/K. More specifically, the first frame 31 and the second frame 32 including the same material have the same or substantially the same thermal expansion coefficient, thus applying equal forces for restricting thermal expansion or contraction of the metal board 2 in the vertical and horizontal directions. This reduces uneven warpage or deformation of the metal board 2 in the vertical and horizontal directions resulting from the difference in thermal expansion coefficient between the metal board 2 and the first frame 31 and between the first frame 31 and the second frame 32. With the first frame 31 and the second frame 32 restricting the thermal expansion or contraction of the metal board 2, less uneven stress is applied on the joints between the metal board 2 and the first and second frames 31 and 32.

The second frame 32 may have the lead terminals 5 on its upper surface. The lead terminals 5 are joined to the upper surface of the second frame 32 with a bond, such as a silver-copper brazing material, gold-tin solder, or a resin bond. The lead terminals 5 are electrically connected to the semiconductor device 4 mounted on the mount 21 with, for example, bonding wires and electrically connected to, for example, an external mounting board, a circuit board, and a power source. The lead terminals 5 are formed from, for example, an alloy of iron, nickel, and cobalt, or an alloy of iron and nickel. The lead terminals 5 extend outward from the outer periphery of the second frame 32.

This structure can reduce unsteady distribution of an electric field around the lead terminals 5. The lead terminals 5 extending outward from the outer periphery of the second frame 32 in a plan view can improve the frequency characteristics of the semiconductor package 1.

Method for Manufacturing Semiconductor Package

The metal board 2 including, for example, a metal material may include copper. In this case, an ingot formed from such a metal material undergoes metal working, such as rolling, punching, pressing, or cutting, to prepare a metal member that serves as the metal board 2.

The first frame 31 and the second frame 32 formed from, for example, a metal material, may be each formed from an iron-nickel-cobalt alloy punched, pressed, or cut into a frame. The second frame 32 is placed to surround the mount 21 and joined to the upper surface of the metal board 2 with, for example, a silver-copper brazing material.

The first frame 31 formed from, for example, sintered aluminum oxide, may be formed from a material obtained by adding an appropriate amount of a sintering aid, such as magnesia, silica, or calcia, to an alumina powder, and adding a solvent to the alumina powder mixture, which is thoroughly kneaded and defoamed to prepare slurry. Using the slurry, a rolled ceramic green sheet is formed with, for example, a doctor blade method, and cut into an appropriate size. Signal lines such as wiring patterns, to which the lead terminals 5 are to be connected and fixed, are screen-printed on the ceramic green sheet prepared by the cutting. The ceramic green sheet is then fired in a reducing atmosphere at about 1600° C. Multiple ceramic green sheets may be stacked on one another before the firing process. The first frame 31 is joined to the side surfaces of the metal board 2. The first frame 31 is joined to the side surfaces of the metal board 2 with a bond, such as an active silver brazing material.

The second frame 32 is prepared in the same manner as the first frame 31. The second frame 32, which has the lead terminals 5 joined to the upper surface with a silver brazing material, is then joined to the upper surface of the metal board 2 with, for example, a silver-copper brazing material to surround the mount 21.

The first frame 31 and the second frame 32 formed from, for example, a metal material, may be each formed from an iron-nickel-cobalt alloy cut into a frame. The second frame 32, which has the lead terminals 5 joined and fixed to the second frame 32 using a bond of an insulating material, such as a resin bond or a glass bond, is also joined to the upper surface of the first frame 31 with, for example, a silver-copper brazing material to surround the mount 21.

The components are joined in the order described below. In a first process, the metal board 2 and the first frame 31 are prepared. In a second process, the metal board 2 and the first frame 31 are joined with a first bond 71. In a third process, the second frame having a smaller thermal expansion coefficient than the metal board 2 is prepared. In a fourth process, the second frame 32 is joined to the upper surfaces of the metal board 2 and the first frame 31 with a second bond 72. The first bond 71 may include silver, and the second bond 72 may include tin. The second bond 72 in the fourth process may have a lower melting temperature than the first bond 71 in the second process.

The semiconductor package 1 according to one or more embodiments of the present invention can be manufactured in the manner described above. The processes may be performed in an order different from the order described above.

Structure of Semiconductor Apparatus

Figure 11:
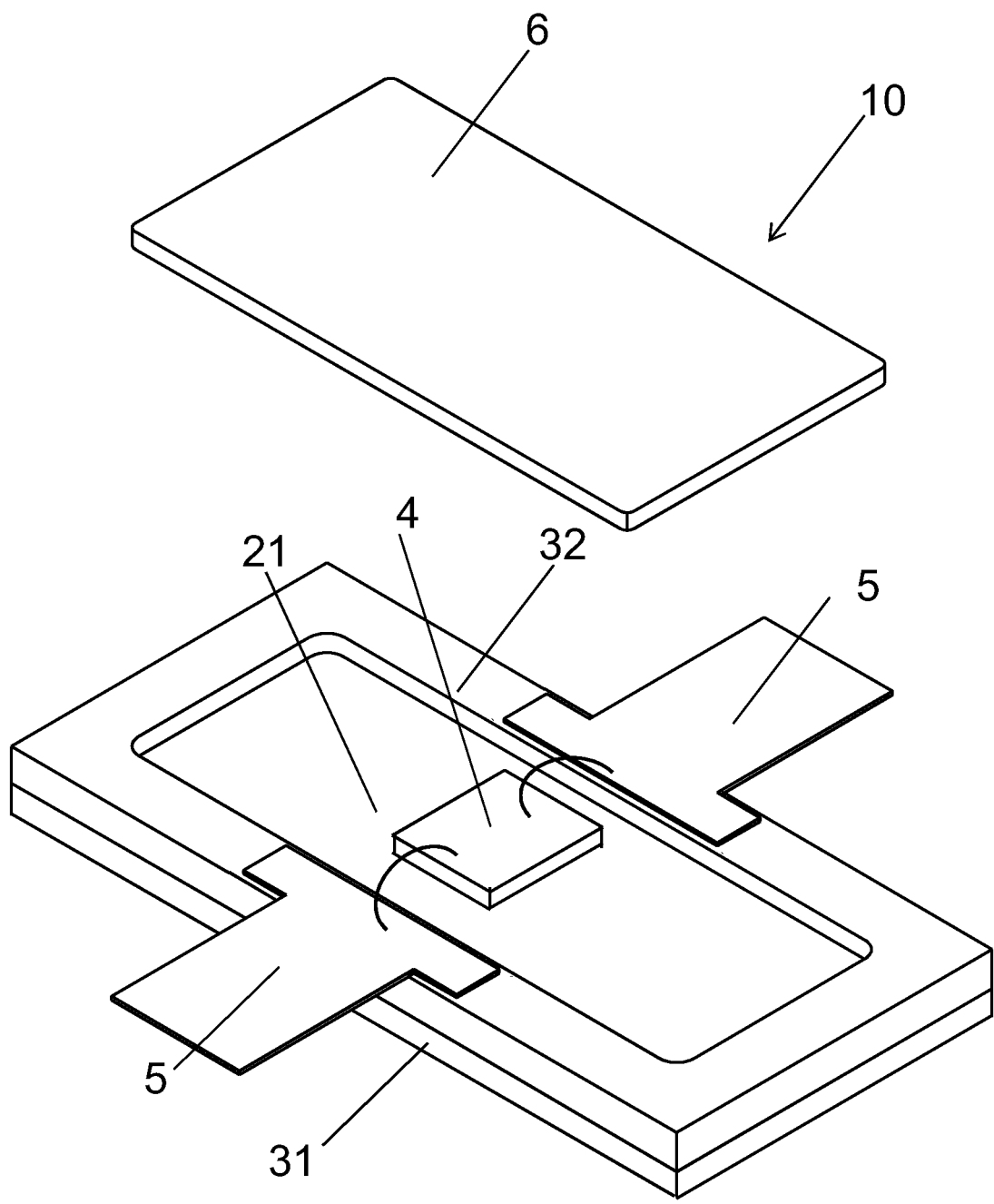
FIG. 11 is a top perspective view of a semiconductor apparatus according to an embodiment of the present invention.

The semiconductor apparatus 10 according to one embodiment of the present invention will now be described in detail with reference to the drawings. FIG. 11 is a top perspective view of the semiconductor apparatus 10 according to the embodiment of the present invention. As shown in FIG. 11, the semiconductor apparatus 10 according to the embodiment of the present invention includes the semiconductor package 1 according to one or more of the embodiments described above, the semiconductor device 4 mounted on the mount 21 of the semiconductor package 1, and a lid 6 joined to the second frame 32 to seal the semiconductor device 4.

The semiconductor apparatus 10 according to the embodiment of the present invention includes the semiconductor device 4 mounted on the mount 21 on the metal board 2. The semiconductor device 4 is electrically connected to the lead terminals 5 with bonding wires. The semiconductor device 4 provides intended input and output of external electrical signals through the lead terminals 5 and the bonding wires.

The lid 6 to seal the semiconductor device 4 is joined to the second frame 32. Examples of the semiconductor device 4 include an integrated circuit (IC), a large-scale integration (LSI) circuit, and a semiconductor device for a power device. The lid 6 is joined to the upper surface of the second frame 32. The lid 6 seals the semiconductor device 4 in the space surrounded by the metal board 2, the second frame 32, and the lid 6. The sealed semiconductor device 4 is less likely to deteriorate after the semiconductor package 1 is used over a long time.

The lid 6 is formed from, for example, a metal material, such as iron, copper, nickel, chromium, cobalt, and tungsten, or an alloy of any of these metals. The second frame 32 and the lid 6 may be joined by, for example, seam welding. The second frame 32 and the lid 6 may be joined with, for example, gold-tin solder.

Although the semiconductor package 1 and the semiconductor apparatus 10 including the semiconductor package 1 according to each of the embodiments are described above, the present invention is not limited to these embodiments. For example, the alloy layer 8 may have a nonuniform thickness. The alloy layer 8 and the metal board 2 may be separated by a transition layer between them. The metal board 2, the first frame 31, and the second frame 32 may have round corners. The alloy layer 8 may have a varying thickness or surface irregularities depending on the materials of the bond 7 and the metal board 2. The embodiments may be modified variously without departing from the spirit and scope of the invention.

REFERENCE SIGNS LIST 1 semiconductor package
2 metal board
21 mount
31 first frame
32 second frame
4 semiconductor device
5 lead terminal
6 lid
7 bond
71 first bond
72 second bond
8 alloy layer
10 semiconductor apparatus

The invention claimed is:

1. A semiconductor package, comprising:
a metal board having an upper surface including a mount on which a semiconductor device is mountable;
a first frame having an inner side surface facing a side surface of the metal board, the first frame having a smaller thermal expansion coefficient than the metal board;
a second frame on upper surfaces of the metal board and the first frame and surrounding the mount, the second frame having a smaller thermal expansion coefficient than the metal board;
a bond between the metal board and the first frame, between the metal board and the second frame, and between the first frame and the second frame; and
an alloy layer between the metal board and the bond, and wherein the side surface of the metal board and the inner side surface of the first frame have curved surfaces joined with the bond.

2. The semiconductor package according to claim 1, wherein
the metal board comprises copper, and the bond comprises tin, and
the alloy layer comprises a copper-tin alloy.

3. The semiconductor package according to claim 1, wherein
the alloy layer includes a crystal elongated in a thickness direction of the metal board.

4. The semiconductor package according to claim 1, wherein
the first frame has the upper surface above the upper surface of the metal board.

5. The semiconductor package according to claim 1, wherein
the metal board has a lower surface below a lower surface of the first frame.

6. A semiconductor apparatus, comprising:
the semiconductor package according to claim 1; and
a semiconductor device mounted on the mount of the semiconductor package.

7. A method for manufacturing a semiconductor package, comprising:
preparing a metal board on which a semiconductor device is mountable and a first frame having a smaller thermal expansion coefficient than the metal board;
joining the metal board and the first frame with a first bond;
preparing a second frame having a smaller thermal expansion coefficient than the metal board; and
joining the second frame to upper surfaces of the metal board and the first frame with a second bond, and
wherein a side surface of the metal board and an inner side surface of the first frame have curved surfaces joined with the first bond.

8. The method for manufacturing a semiconductor package according to claim 7, wherein
the first bond comprises silver, and the second bond comprises tin.

9. A semiconductor package, comprising:
a metal board having an upper surface including a mount on which a semiconductor device is mountable;
a first frame having an inner side surface facing a side surface of the metal board, the first frame having a smaller thermal expansion coefficient than the metal board;
a second frame on upper surfaces of the metal board and the first frame and surrounding the mount, the second frame having a smaller thermal expansion coefficient than the metal board;
a bond between the metal board and the second frame; and
an alloy layer between the metal board and the bond, and
wherein a side surface of the metal board and the inner side surface of the first frame have curved surfaces joined with the bond.

10. The semiconductor package according to claim 9, wherein
the bond comprises:
a first bond between the metal board and the first frame; and
a second bond between the metal board and the second frame.

11. The semiconductor package according to claim 10, wherein
the alloy layer is located between the metal board and the first bond, and between the metal board and the second bond.

12. The semiconductor package according to claim 10, wherein
the second bond reaches between the first frame and the second frame.

13. The semiconductor package according to claim 9, wherein
at least a part of the inner surface of the first frame is in contact with the side surfaces of the metal board.

14. The semiconductor package according to claim 9, wherein
at least a part of the inner surface of the first frame is spaced apart from the metal board.

15. The semiconductor package according to claim 9, wherein
the semiconductor package satisfies $\alpha \geq \beta$ and $H1 \leq H2$, where $\alpha$ is the thermal expansion coefficient of the second frame, $\beta$ is the thermal expansion coefficient of the first frame, $H1$ is the thickness of the second frame orthogonal to the mount, and $H2$ is the thickness of the first frame orthogonal to the mount.

16. The semiconductor package according to claim 9, wherein
the alloy layer has a lower end below the upper surface of the metal board.

17. The semiconductor package according to claim 9, wherein
the alloy layer has a lower end below the upper surface of the first frame.

18. The semiconductor package according to claim 9, wherein
the alloy layer has an inner end inward from an inner periphery of the second frame.

19. The semiconductor package according to claim 9, wherein
the inner side surface of the first frame has a curved surface joined with the bond.

* * * * *